(12) United States Patent
Huang et al.

(10) Patent No.: US 7,019,406 B2
(45) Date of Patent: Mar. 28, 2006

(54) THERMALLY ENHANCED SEMICONDUCTOR PACKAGE

(75) Inventors: Chien-Ping Huang, Taichung Hsien (TW); Cheng-Hsu Hsiao, Taichung Hsien (TW)

(73) Assignee: Siliconware Precision Industries Co., Ltd., (TW)

( * ) Notice: Subject to any disclaimer, the term of this patent is extended or adjusted under 35 U.S.C. 154(b) by 0 days.

(21) Appl. No.: 10/635,168

(22) Filed: Aug. 5, 2003

(65) Prior Publication Data

US 2004/0238945 A1 Dec. 2, 2004

(30) Foreign Application Priority Data

May 28, 2003 (TW) ................................. 92114343 A

(51) Int. Cl.
*H01L 23/48* (2006.01)
*H01L 23/52* (2006.01)
*H01L 29/40* (2006.01)

(52) U.S. Cl. ................. 257/778; 257/779; 257/787
(58) Field of Classification Search ............... 257/706, 257/707, 734, 737, 738, 778, 779, 780, 781, 257/787, 796

See application file for complete search history.

(56) References Cited

U.S. PATENT DOCUMENTS

| 5,825,087 | A | * | 10/1998 | Iruvanti et al. | ............. 257/707 |
| 6,271,469 | B1 | | 8/2001 | Ma et al. | ................... 174/52.4 |
| 6,287,893 | B1 | | 9/2001 | Elenius et al. | ............. 438/108 |
| 6,507,104 | B1 | * | 1/2003 | Ho et al. | ...................... 257/712 |
| 6,603,198 | B1 | * | 8/2003 | Akram et al. | ............... 257/686 |
| 6,661,103 | B1 | * | 12/2003 | Akram | ........................ 257/787 |

* cited by examiner

*Primary Examiner*—Hoai Pham
(74) *Attorney, Agent, or Firm*—Peter F. Corless; Steven M. Jensen; Edwards Angell Palmer & Dodge LLP

(57) ABSTRACT

A thermally enhanced semiconductor package and a fabrication method thereof are provided. A plurality of conductive bumps are formed on bond pads on an active surface of a chip. A heat sink is attached to an inactive surface of the chip and has a surface area larger than that of the chip. An encapsulation body encapsulates the heat sink, chip and conductive bumps, while exposing a bottom or surfaces, not for attaching the chip, of the heat sink and ends of the conductive bumps outside. A plurality of conductive traces are formed on the encapsulation body and electrically connected to the ends of the conductive bumps. A solder mask layer is applied over the conductive traces and formed with a plurality of openings for exposing predetermined portions of the conductive traces. A solder ball is implanted on each exposed portion of the conductive traces.

10 Claims, 6 Drawing Sheets

THERMALLY ENHANCED SEMICONDUCTOR PACKAGE

FIELD OF THE INVENTION

The present invention relates to semiconductor packages and fabrication methods thereof, and more particularly, to a thermally enhanced semiconductor package and a method for fabricating the semiconductor package.

BACKGROUND OF THE INVENTION

A semiconductor package is a structure used to accommodate at least one integrated circuit component such as semiconductor chip and preferably made compact in size. In correspondence with this goal, there is a type of small scale semiconductor package, named chip scale package (CSP), which has a size substantially equal to or slightly larger than that of the chip incorporated therein.

U.S. Pat. No. 6,287,893 discloses a chip scale package which forms a plurality of build-up layers directly on a semiconductor chip without using a chip carrier such as substrate or lead frame for accommodating the chip. As shown in FIG. 5, the plurality of build-up layers formed on an active surface 100 of the chip 10 include: a dielectric layer 11 disposed over the active surface 100 of the chip 10 and formed with a plurality of vias 110 for exposing bond pads 101 formed on the chip 10; and a plurality of conductive traces 12 formed on the dielectric layer 11 and electrically connected to the exposed bond pads 101 of the chip 10. A solder mask layer 13 is applied over the conductive traces 12 and formed with a plurality of openings 130, allowing predetermined portions of the conductive traces 12 to be exposed via the openings 130 and bonded to solder balls 14 which serve as input/output (I/O) connections for electrically connecting the chip 10 to an external device such as printed circuit board (not shown). This chip scale package, however, is defective of not able to provide more surface area, which is limited in accordance with the chip size, for accommodating more solder balls required for the external electrical connection.

Accordingly, U.S. Pat. No. 6,271,469 discloses another package structure which forms the build-up layers on an encapsulated chip so as to provide additional surface area for external I/O connections. As shown in FIG. 6, this package structure utilizes an encapsulation body 15 for encapsulating a non-active surface 102 and side surfaces 103 of the chip 10, allowing the active surface 100 of the chip 10 to be exposed and flush with a surface 150 of the encapsulation body 15. After the dielectric layer 11 (hereinafter referred to as "first dielectric layer") and conductive traces 12 (hereinafter referred to as "first conductive traces") are formed on the chip 10, a second dielectric layer 16 is disposed over the first conductive traces 12 and formed with a plurality of vias 160 for exposing predetermined portions of the first conductive traces 12. A plurality of second conductive traces 17 are formed on the second dielectric layer 16 and electrically connected to the exposed portions of the first conductive traces 12. Then, the solder mask layer 13 is applied over the second conductive traces 17, allowing predetermined portions of the second conductive traces 17 to be exposed via the openings 130 of the solder mask layer 13 and bonded to the solder balls 14.

However, a significant drawback incurred by the above chip scale package and the encapsulated package structure is that when a laser drilling technique is employed to form vias through the first dielectric layer for exposing the bond pads on the chip, the bond pads underneath the first dielectric layer cannot be easily and precisely recognized by laser in position, making the fabricated vias not able to accurately correspond to the positions of the bond pads. As a result, the bond pads on the chip cannot be completely exposed, and the incompletely-exposed bond pads would degrade their electrical connection with the first conductive traces formed on the first dielectric layer, thereby damaging production yield of the fabricated packages. Moreover, as shown in FIG. 6, the chip is entirely encapsulated by the encapsulation body, making heat produced from the chip not able to be effectively dissipated, which may damage the chip by overheat.

Therefore, the problem to be solved herein is to provide a thermally enhanced semiconductor package which can effectively dissipate heat from an incorporated chip and assure electrical connection between conductive traces and bond pads formed on the chip.

SUMMARY OF THE INVENTION

A primary objective of the present invention is to provide a thermally enhanced semiconductor package and a fabrication method thereof, to allow a chip to be attached with a heat sink whose surface area is equal to that of the package so as to effectively dissipate heat produced from the chip and thereby improve heat dissipating efficiency.

Another objective of the present invention is to provide a thermally enhanced semiconductor package and a fabrication method thereof, to form a plurality of conductive bumps respectively on bond pads of a chip so as to ease positional recognition of the bond pads and assure electrical connection between the bond pads and conductive traces, thereby improving production yield of the semiconductor package.

In accordance with the foregoing and other objectives, the present invention proposes a thermally enhanced semiconductor package, comprising: at least one chip having an active surface and an opposite inactive surface, the active surface formed with a plurality of bond pads thereon; a conductive bump formed on each of the bond pads of the chip; a heat sink attached to the inactive surface of the chip and having a surface area larger than that of the chip; an encapsulation body for encapsulating the beat sink, the chip, and the conductive bumps, wherein surfaces, other than that for attaching the chip, of the heat sink and ends of the conductive bumps are exposed to outside of the encapsulation body; a plurality of conductive traces formed on the encapsulation body and electrically connected to the exposed ends of the conductive bumps; a solder mask layer applied over the conductive traces and formed with a plurality of openings for exposing predetermined portions of the conductive traces; and a solder ball formed on each of the exposed portions of the conductive traces.

A fabrication method of the above semiconductor package comprises the steps of: preparing a wafer comprising a plurality of chips, each chip having an active surface and an opposite inactive surface, and the active surface formed with a plurality of bond pads thereon; forming a conductive bump on each of the bond pads of the chips; singulating the wafer to separate apart the plurality of chips, each chip having a plurality of the conductive bumps formed thereon; providing a heat sink module plate comprising a plurality of heat sinks, and attaching the chips to a surface of the heat sink module plate, wherein the inactive surface of at least one of the chips is mounted on each heat sink, and the heat sink has a surface area larger than that of the corresponding chip; fabricating an encapsulation body for encapsulating the heat sink module plate, the chips, and the conductive bumps, and allowing surfaces, other than that for attaching the chips, of the heat sink module plate and ends of the conductive bumps to be exposed to outside of the encapsulation body; forming a plurality of conductive traces on the encapsulation body and electrically connecting the conductive traces to the exposed ends of the conductive bumps; applying a solder mask layer over the conductive traces and forming a plurality of openings through the solder mask layer for exposing predetermined portions of the conductive traces; forming a solder ball on each of the exposed portions of the conductive traces; and cutting the encapsulation body and the heat sink module plate to separate apart the plurality of heat sinks and thereby form a plurality of semiconductor packages each having the individual heat sink.

The above semiconductor package utilizes a heat sink directly adhered to the chip, and the heat sink is exposed to outside of the encapsulation body encapsulating the chip and has a surface area equal to that of the package, which can thereby effectively dissipate heat produced from the chip and improve heat dissipating efficiency of the package. Moreover, a plurality of conductive bumps are directly formed on bond pads of the chip, with their ends exposed to outside of the encapsulation body, so as to allow the positions of the bond pads to be easily recognized and allow the conductive traces formed on the encapsulation body to be well electrically connected to the bond pads through the conductive bumps, thereby improving production yield of the semiconductor package. Therefore, the above semiconductor package according to the invention is advantageous over the prior art (FIGS. 5 and 6) in which bond pads of the chip cannot be precisely recognized and completely exposed by vias formed through the dielectric layer (namely, the first dielectric layer applied over the chip) in the use of a laser drilling technique and the incompletely-exposed bond pads degrade their electrical connection with conductive traces subsequently formed on the first dielectric layer.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a thermally enhanced semiconductor package and a fabrication method thereof proposed by the present invention are described in detail with reference to FIGS. 1, 2A–2F, 3 and 4 as follows.

First Preferred Embodiment

Figure 1:
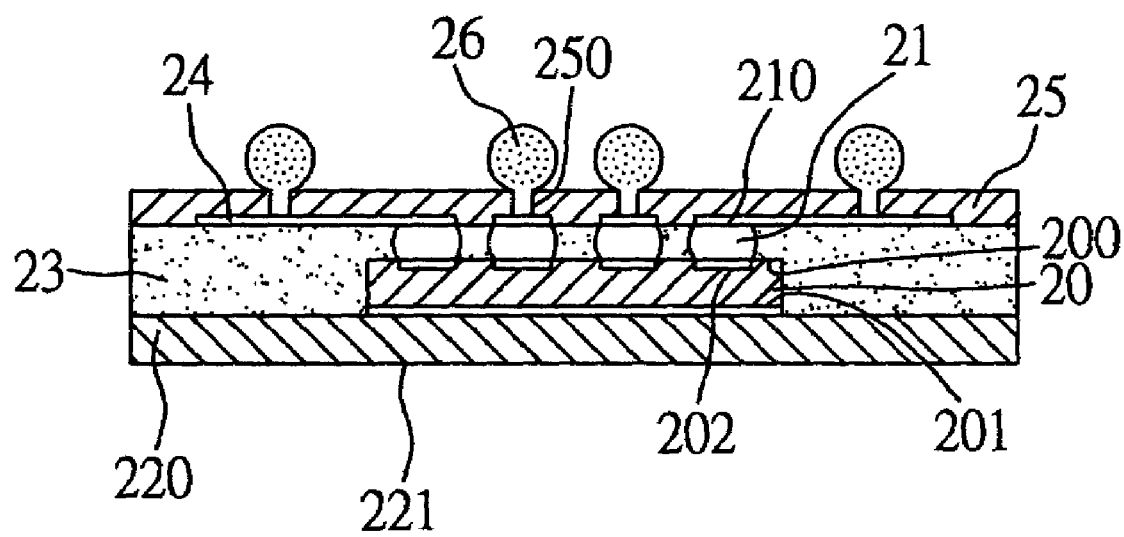
FIG. 1 is a cross-sectional view of a semiconductor package according to a first preferred embodiment of the invention.

As shown in FIG. 1, the thermally enhanced semiconductor package according to the first preferred embodiment of the invention comprises: at least one chip 20 having an active surface 200 and an opposite inactive surface 201, the active surface 200 formed with a plurality of bond pads 202 thereon; a conductive bump 21 formed on each of the bond pads 202 of the chip 20; a heat sink 220 attached to the inactive surface 201 of the chip 20 and having a surface area larger than that of the chip 20; an encapsulation body 23 for encapsulating the heat sink 220, chip 20 and conductive bumps 21, wherein a bottom 221 of the heat sink 220 and ends 210 of the conductive bumps 21 are exposed to outside of the encapsulation body 23; a plurality of conductive traces 24 formed on the encapsulation body 23 and electrically connected to the exposed ends 210 of the conductive bumps 21; a solder mask layer 25 applied over the conductive traces 24 and formed with a plurality of openings 250 for exposing predetermined portions of the conductive traces 24; and a solder ball 26 formed on each of the exposed portions of the conductive traces 24.

The above semiconductor package can be fabricated by the procedural steps shown in FIGS. 2A to 2F.

Figure 2A:
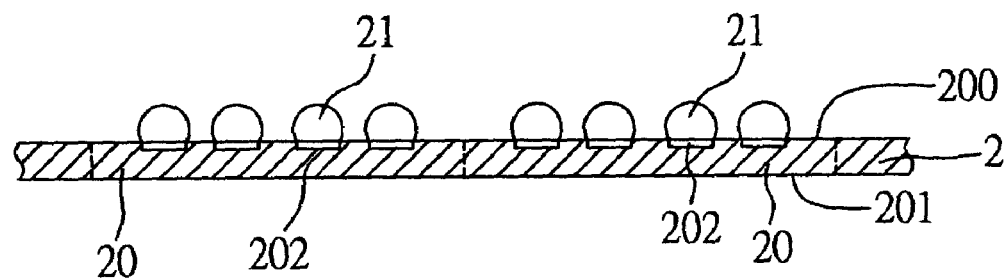
FIGS. 2A to 2F are schematic diagrams showing procedural steps of a fabrication method of the semiconductor package shown in FIG. 1.

Referring to FIG. 2A, the first step is to prepare a wafer 2 which is integrally formed of a plurality of chips 20, each chip 20 having an active surface 200 and an opposite inactive surface 201 and formed with a plurality of bond pads 202 on the active surface 200. A bumping or stud bumping process is performed to form a conductive bump 21 on each of the bond pads 202 of the chips 20; the conductive bump 21 can be a solder bump, a high lead bump, a gold (Au) bump, or an Au stud bump, etc.

Figure 2B:
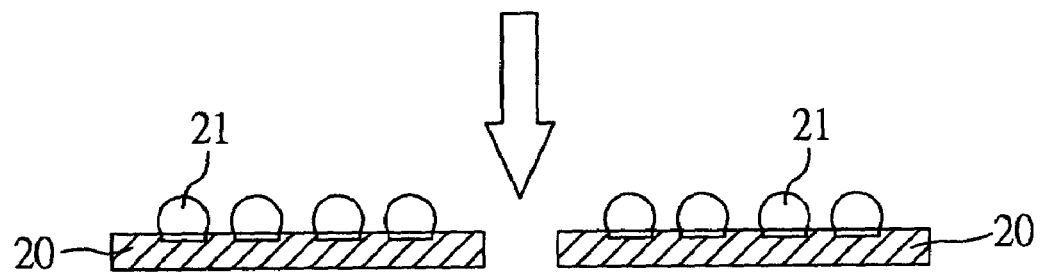

Referring to FIG. 2B, the next step is to implement a singulation process to cut through the wafer 2 and separate the plurality of integrally formed chips 20 into individual chips 20, each chip 20 having a plurality of the conductive bumps 21 formed thereon.

Figure 2C:
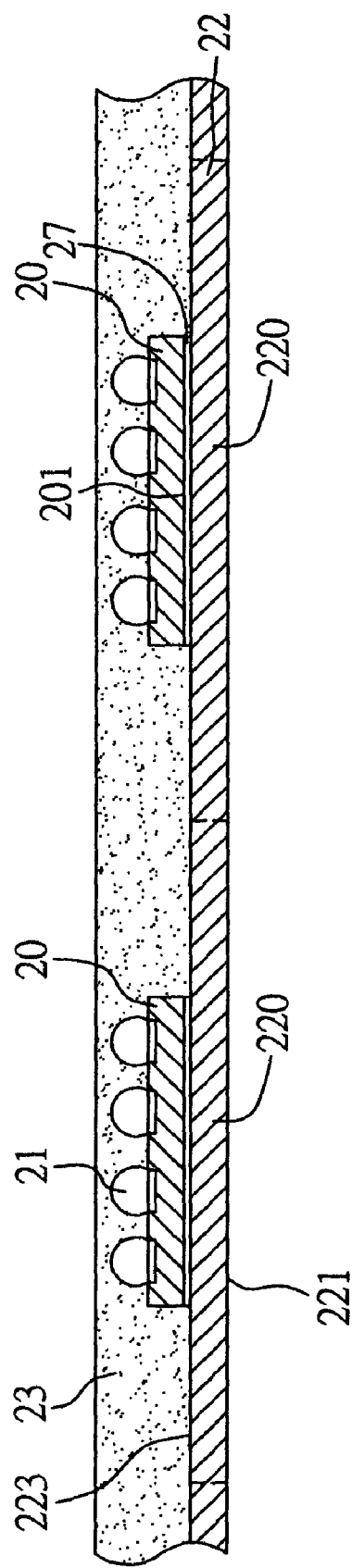

Referring to FIG. 2C, a heat sink module plate 22 is provided comprising a plurality of heat sinks 220, and the individual chips 20 are attached to a surface 223 of the heat sink module plate 22 by an adhesive 27 in such a manner that the inactive surface 201 of at least one of the chips 20 is mounted on each heat sink 220; the heat sink 220 has a surface area larger than that of the corresponding chip 20. The heat sink module plate 22 is made of a conductive metallic material such as copper, and the adhesive 27 is preferably a conductive paste.

Next, a molding process is carried out using a conventional resin material such as epoxy resin to form an encapsulation body 23 which encapsulates the heat sink module plate 22, chips 20 and conductive bumps 21, allowing a bottom 221 or the surfaces, other than the surface 223 for attaching the chips 20, of the heat sink module plate 22 to be exposed to outside of the encapsulation body 23.

Figure 2D:
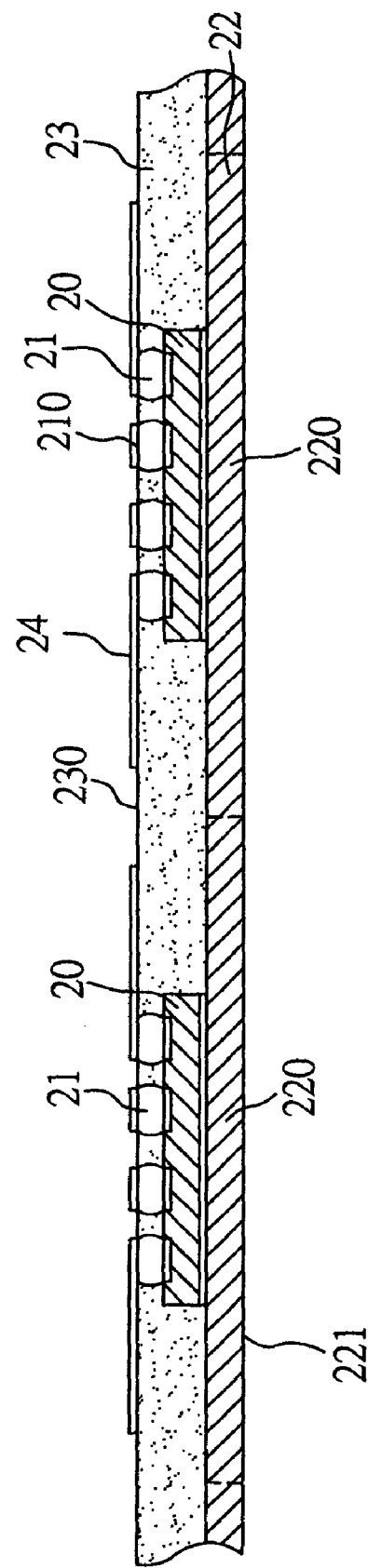

Referring to FIG. 2D, a grinding technique such as mechanical grinding is employed to remove part of the encapsulation body 23 and expose ends 210 of the conductive bumps 21, making the exposed ends 210 of the conductive bumps 21 flush with a surface 230 of the encapsulation body 23, such that subsequent fabrication processes can be performed to fabricate build-up layers on the exposed conductive bumps 21. The heat sinks 220 or heat sink module plate 22, sized larger than the chips 20, allow the encapsulation body 23 formed thereon to provide more surface area by the surface 230 of the encapsulation body 23 for subsequently fabricating build-up layers and more I/O (input/output) connections (not shown) thereon.

Thereafter, a conventional photolithography technique is used to form a plurality of conductive traces 24 on the surface 230 of the encapsulation body 23, and each of the conductive traces 24 is adapted to be electrically connected to at least one of the exposed ends 210 of the conductive bumps 21. The conductive traces 24 are made of a conductive material such as copper, aluminum, or an alloy thereof.

Figure 2E:
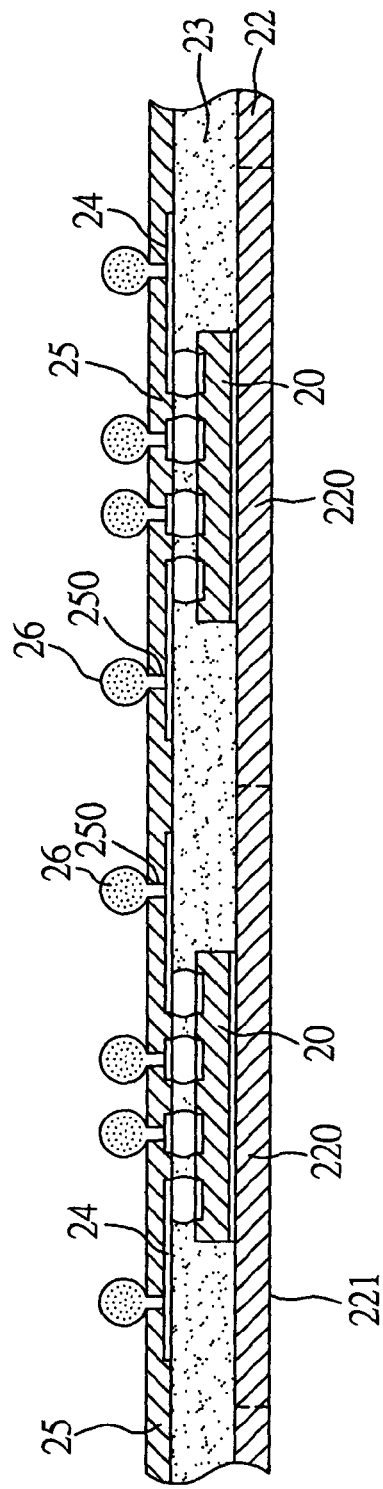

Referring to FIG. 2E, after the conductive traces 24 are formed on the encapsulation body 23, a solder mask layer 25 is applied over the conductive traces 24 and formed with a plurality of openings 250 for exposing predetermined portions of the conductive traces 24; the exposed portions of the conductive traces 24 can be terminals. Then, a conventional screen printing technique is adopted to form a solder ball 26 on each of the exposed portions (terminals) of the conductive traces 24. The solder balls 26 serve as I/O connections for electrically connecting each of the chips 20 to an external device such as printed circuit board (not shown).

Figure 2F:
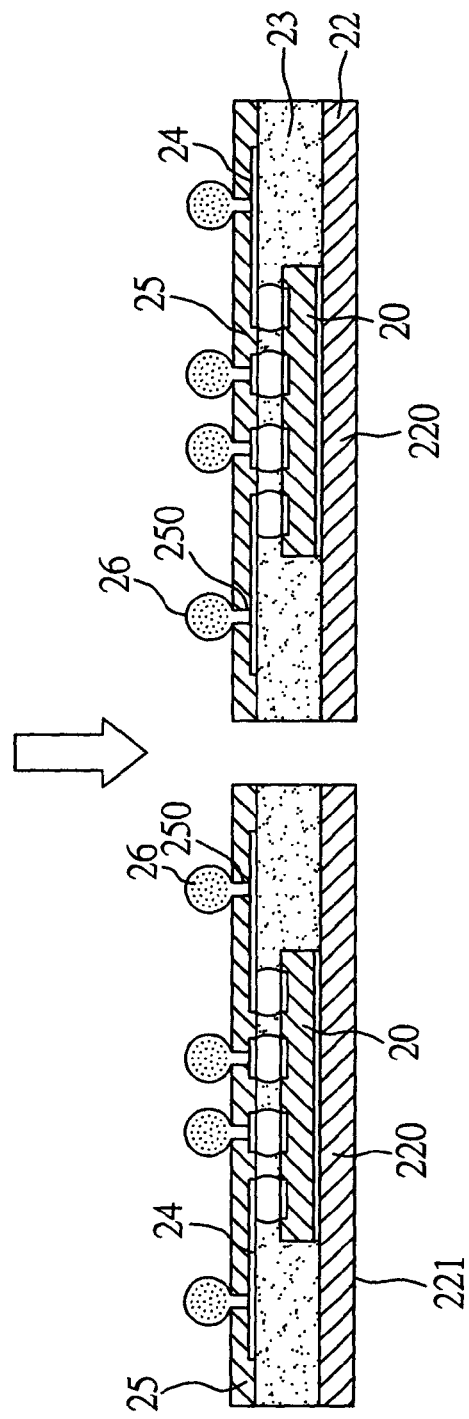

Finally, referring to FIG. 2F, a singulation process is performed to cut the encapsulation body 23 and the heat sink module plate 22 to separate apart the plurality of heat sinks 220, so as to form a plurality of semiconductor packages each having the individual heat sink 220 whose surface area is thus equal to that of the corresponding semiconductor package.

Figure 5:
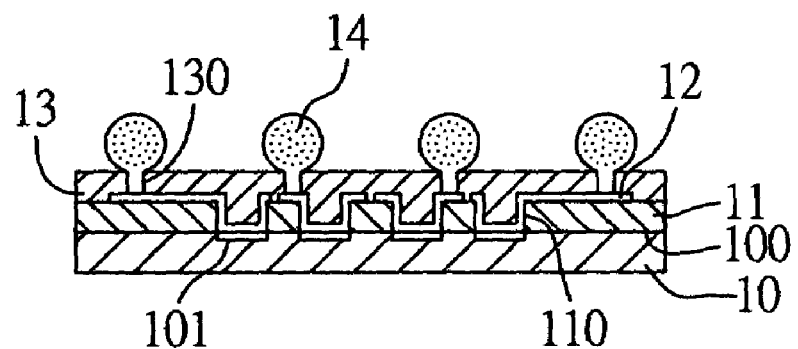
FIG. 5 (PRIOR ART) is a cross-sectional view of a conventional semiconductor package.
Figure 6:
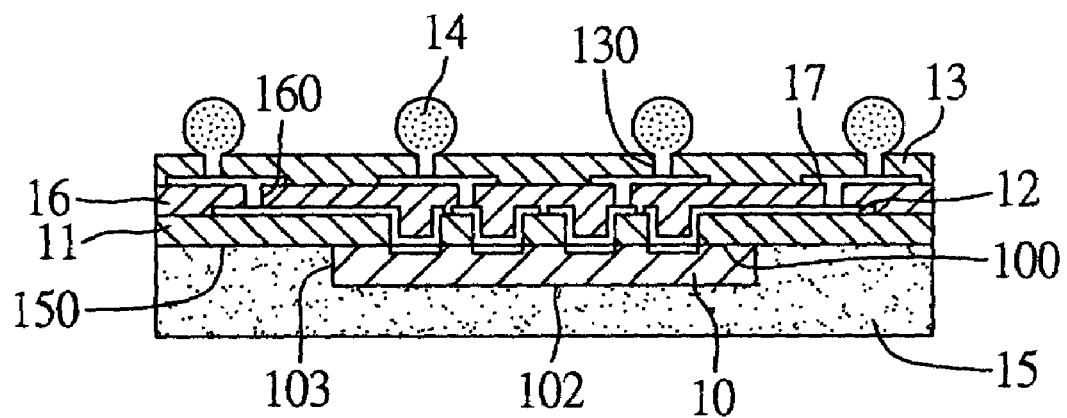
FIG. 6 (PRIOR ART) is a cross-sectional view of another conventional semiconductor package.

The above semiconductor package utilizes a heat sink directly adhered to the chip, and the heat sink is exposed to outside of the encapsulation body encapsulating the chip and has a surface area equal to that of the package, which can thereby effectively dissipate heat produced from the chip and improve heat dissipating efficiency of the package. Moreover, a plurality of conductive bumps are directly formed on bond pads of the chip, with their ends exposed to outside of the encapsulation body, so as to allow the positions of the bond pads to be easily recognized and allow the conductive traces formed on the encapsulation body to be well electrically connected to the bond pads through the conductive bumps, thereby improving production yield of the semiconductor package. Therefore, the above semiconductor package according to the invention is advantageous over the prior art (FIGS. 5 and 6) in which bond pads of the chip cannot be precisely recognized and completely exposed by vias formed through the dielectric layer (namely, the first dielectric layer applied over the chip) in the use of a laser drilling technique and the incompletely-exposed bond pads degrade their electrical connection with conductive traces subsequently formed on the first dielectric layer.

Second Preferred Embodiment

Figure 3:
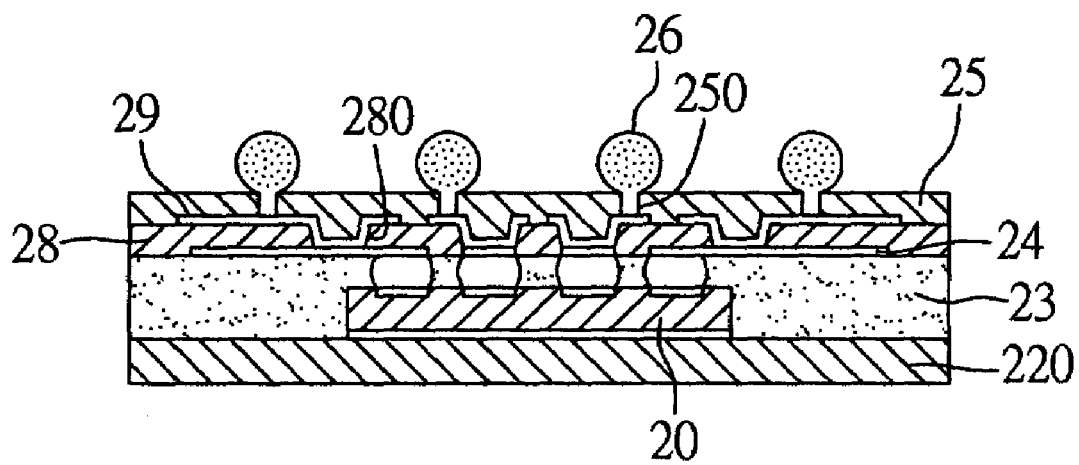
FIG. 3 is a cross-sectional view of a semiconductor package according to a second preferred embodiment of the invention.

FIG. 3 illustrates a semiconductor package according to the second preferred embodiment of the invention. As shown in FIG. 3, this semiconductor package is structurally similar to that of the first embodiment, with the difference in that after the conductive traces 24 (hereinafter referred to as "first conductive traces") are formed on the encapsulation body 23, a dielectric layer 28 is applied over the first conductive traces 24, and a laser drilling technique is employed to form a plurality of vias 280 through the dielectric layer 28 for exposing predetermined portions of the first conductive traces 24. Then, a plurality of second conductive traces 29 are formed on the dielectric layer 28, and each of the second conductive traces 29 is electrically connected to at least one of the exposed portions of the first conductive traces 24.

Thereafter, the solder mask layer 25 is applied over the second conductive traces 29 and formed with a plurality of openings 250 for exposing predetermined portions of the second conductive traces 29; the exposed portions of the second conductive traces 29 can be terminals. Subsequently, a screen printing technique is implemented to deposit the solder balls 26 acting as I/O connections on the exposed portions (terminals) of the second conductive traces 29 respectively to be electrically connected to an external device (not shown).

Besides the improvements achieved by the semiconductor package of the first embodiment, the dielectric layer and second conductive traces of this embodiment increase the build-up layers fabricated on the chip and improve flexibility in the arrangement of the conductive traces in the semiconductor package, thereby making the chip more effectively electrically connected to the solder balls and external device to facilitate operation thereof.

Third Preferred Embodiment

Figure 4:
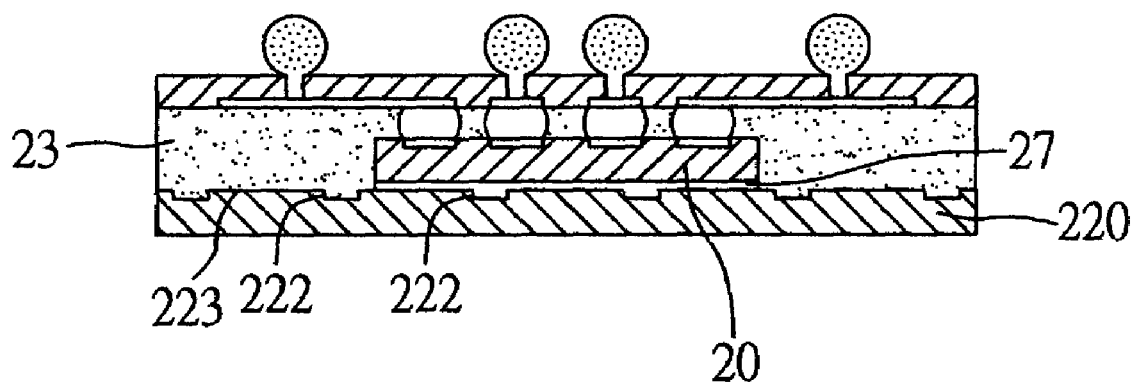
FIG. 4 is a cross-sectional view of a semiconductor package according to a third preferred embodiment of the invention.

FIG. 4 illustrates a semiconductor package according to the third preferred embodiment of the invention. As shown in FIG. 4, this semiconductor package is structurally similar to that of the first embodiment, with the difference in that the surface 223 for attaching the chip 20 of the heat sink 220 is formed with a plurality of recessed portions 222 to allow the resin material forming the encapsulation body 23 and the adhesive 27 adhering the chip 20 and heat sink 220 to fill into the recessed portions 222, so as to enhance adhesion between the surface 223 of the heat sink 220 and the encapsulation body 23 and adhesion between the surface 223 and the chip 20. Alternatively, the surface 223 of the heat sink 220 can be roughened (not shown) to also make the heat sink 220 more strongly adhered to the encapsulation body 23 and the chip 20.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A thermally enhanced semiconductor package, comprising:

at least one chip having an active surface and an opposite inactive surface, the active surface formed with a plurality of bond pads thereon;

a conductive bump formed on each of the bond pads of the chip;

a heat sink attached to the inactive surface of the chip and having a surface area larger than that of the chip;

an encapsulation body for encapsulating the heat sink, the chip, and the conductive bumps, wherein a plurality of surfaces, other than that for attaching the chip, of the heat sink and ends of the conductive bumps are exposed to outside of the encapsulation body;

a plurality of first conductive traces formed on the encapsulation body and electrically connected to the exposed ends of the conductive bumps; and a solder mask layer applied over the first conductive traces and formed with a plurality of openings for exposing predetermined portions of the first conductive traces.

2. The thermally enhanced semiconductor package of claim 1, further comprising: a solder ball formed on each of the exposed portions of the first conductive traces.

3. The thermally enhanced semiconductor package of claim 1, further comprising: at least one dielectric layer and at least one second conductive trace, which are formed between the first conductive traces and the solder mask layer.

4. The thermally enhanced semiconductor package of claim 3, wherein the second conductive trace is formed on the dielectric layer and electrically connected to the exposed portions of the first conductive traces.

5. The thermally enhanced semiconductor package of claim 4, further comprising: a solder mask layer applied over the second conductive traces and formed with a plurality of openings for exposing predetermined portions of the second conductive traces.

6. The thermally enhanced semiconductor package of claim 5, further comprising: a solder ball formed on each of the exposed portions of the second conductive traces.

7. The thermally enhanced semiconductor package of claim 1, wherein the surface for attaching the chip of the heat sink is formed with a plurality of recessed portions to enhance adhesion between the surface of the heat sink and the encapsulation body and adhesion between the surface and the chip.

8. The thermally enhanced semiconductor package of claim 1, wherein the surface for attaching the chip of the heat sink is roughened to enhance adhesion between the surface of the heat sink and the encapsulation body and adhesion between the surface and the chip.

9. The thermally enhanced semiconductor package of claim 1, wherein the conductive bump is selected from the group consisting of solder bump, high lead bump, gold bump, and gold stud bump.

10. The thermally enhanced semiconductor package of claim 3, wherein the dielectric layer is applied over the first conductive traces and formed with a plurality of vias for exposing the predetermined portions of the first conductive traces.

* * * * *